(12) United States Patent
Khlat et al.

(10) Patent No.: US 10,879,852 B2
(45) Date of Patent: Dec. 29, 2020

(54) POWER MANAGEMENT CIRCUIT AND RELATED RADIO FREQUENCY FRONT-END CIRCUIT

(71) Applicant: Qorvo US, Inc., Greensboro, NC (US)

(72) Inventors: Nadim Khlat, Cugnaux (FR); Alexander Wayne Hietala, Phoenix, AZ (US)

(73) Assignee: Qorvo US, Inc., Greensboro, NC (US)

( * ) Notice: Subject to any disclaimer, the term of this patent is extended or adjusted under 35 U.S.C. 154(b) by 393 days.

(21) Appl. No.: 15/856,143

(22) Filed: Dec. 28, 2017

(65) Prior Publication Data
US 2019/0052232 A1 Feb. 14, 2019

Related U.S. Application Data

(60) Provisional application No. 62/542,379, filed on Aug. 8, 2017.

(51) Int. Cl.
*H03F 1/30* (2006.01)
*H03F 1/02* (2006.01)
(Continued)

(52) U.S. Cl.
CPC ............ *H03F 1/30* (2013.01); *H02M 3/07* (2013.01); *H03F 1/0222* (2013.01);
(Continued)

(58) Field of Classification Search
CPC ........ H03F 1/30; H03F 1/0222; H03F 1/0227; H03F 3/19; H03F 3/245; H03F 3/68;
(Continued)

(56) References Cited

U.S. PATENT DOCUMENTS

| 5,959,515 A | 9/1999 | Cornett et al. |
| 6,434,122 B2 | 8/2002 | Barabash et al. |

(Continued)

OTHER PUBLICATIONS

Final Office Action for U.S. Appl. No. 16/217,121, dated Jan. 28, 2020, 6 pages.
(Continued)

*Primary Examiner* — Lee Nguyen
(74) *Attorney, Agent, or Firm* — Withrow & Terranova, P.L.L.C.

(57) ABSTRACT

A power management circuit and related radio frequency (RF) front-end circuit are provided. In examples discussed herein, a power management circuit can be incorporated into an RF front-end circuit to support RF beamforming in millimeter wave spectrum(s). In this regard, the power management circuit is configured to generate multiple output voltages to drive multiple power amplifier subarrays in the RF front-end circuit. More specifically, the power management circuit is configured to generate the output voltages based on a voltage scaling factor(s) such that each of the output voltages corresponds proportionally to a battery voltage received by the power management circuit. As such, the output voltages can be dynamically controlled based on the voltage scaling factor(s) to maximize operating efficiency of the power amplifier subarrays. As a result, it is possible to reduce heat dissipation of the power amplifier subarrays and improve overall thermal performance of the RF front-end circuit.

20 Claims, 6 Drawing Sheets

(51) Int. Cl.
*H03F 3/19* (2006.01)
*H03F 3/24* (2006.01)
*H02M 3/07* (2006.01)
*H03F 3/68* (2006.01)
*H02M 1/00* (2006.01)

(52) U.S. Cl.
CPC ............. *H03F 1/0227* (2013.01); *H03F 3/19* (2013.01); *H03F 3/245* (2013.01); *H03F 3/68* (2013.01); *H02M 2001/009* (2013.01); *H03F 2200/105* (2013.01); *H03F 2200/451* (2013.01)

(58) Field of Classification Search
CPC ......... H03F 2001/009; H03F 2200/105; H03F 2200/451; H02M 3/07
USPC .......................................... 455/127.1–127.3
See application file for complete search history.

(56) References Cited

U.S. PATENT DOCUMENTS

| | | |
|---|---|---|
| 6,853,286 B2 | 2/2005 | Nikawa et al. |
| 8,008,970 B1 | 8/2011 | Homol et al. |
| 8,571,498 B2 | 10/2013 | Khlat |
| 8,909,175 B1 | 12/2014 | McCallister |
| 9,112,452 B1 | 8/2015 | Khlat |
| 9,484,865 B2 | 11/2016 | Kobayashi et al. |
| 2006/0244513 A1 | 11/2006 | Yen et al. |
| 2009/0045877 A1 | 2/2009 | Wang et al. |
| 2010/0219887 A1 | 9/2010 | Ichitsubo et al. |
| 2010/0283534 A1 | 11/2010 | Pierdomenico |
| 2012/0062205 A1 | 3/2012 | Levesque et al. |
| 2012/0176196 A1 | 7/2012 | Khlat |
| 2012/0212316 A1 | 8/2012 | Cho |
| 2012/0281597 A1 | 11/2012 | Khlat et al. |
| 2013/0043557 A1 | 2/2013 | Cho |
| 2013/0141064 A1 | 6/2013 | Kay et al. |
| 2013/0141068 A1 | 6/2013 | Kay et al. |
| 2013/0165132 A1 | 6/2013 | Goedken et al. |
| 2013/0285750 A1 | 10/2013 | Chowdhury et al. |
| 2013/0307617 A1 | 11/2013 | Khlat et al. |
| 2014/0062590 A1* | 3/2014 | Khlat .................. H03G 3/3042 330/127 |
| 2014/0105327 A1 | 4/2014 | Geng et al. |
| 2015/0091653 A1 | 4/2015 | Kobayashi et al. |
| 2015/0180422 A1 | 6/2015 | Khlat et al. |
| 2015/0234402 A1 | 8/2015 | Kay et al. |
| 2015/0349724 A1 | 12/2015 | Wang et al. |
| 2016/0079165 A1 | 3/2016 | Mei et al. |
| 2016/0164476 A1 | 6/2016 | Wang et al. |
| 2016/0181995 A1 | 6/2016 | Nentwig et al. |
| 2016/0233580 A1* | 8/2016 | Aparin ..................... H01Q 3/28 |
| 2017/0124013 A1 | 5/2017 | Vaillancourt et al. |

OTHER PUBLICATIONS

Non-Final Office Action for U.S. Appl. No. 15/836,334, dated Nov. 30, 2018, 5 pages.
Ex Parte Quayle Action for U.S. Appl. No. 15/678,245, dated Jun. 6, 2018, 4 pages.
Notice of Allowance for U.S. Appl. No. 15/825,562, dated Jun. 11, 2018, 8 pages.
Notice of Allowance for U.S. Appl. No. 15/830,686, dated May 24, 2018, 8 pages.
Notice of Allowance for U.S. Appl. No. 15/837,496, dated May 25, 2018, 8 pages.
Non-Final Office Action for U.S. Appl. No. 16/217,121, dated Oct. 24, 2019, 6 pages.
Notice of Allowance for U.S. Appl. No. 15/720,894, dated Sep. 11, 2019, 10 pages.

* cited by examiner

POWER MANAGEMENT CIRCUIT AND RELATED RADIO FREQUENCY FRONT-END CIRCUIT

RELATED APPLICATIONS

This application claims the benefit of provisional patent application Ser. No. 62/542,379, filed Aug. 8, 2017, the disclosure of which is hereby incorporated herein by reference in its entirety.

FIELD OF THE DISCLOSURE

The technology of the disclosure relates generally to radio frequency (RF) power amplifier circuits.

BACKGROUND

Mobile communication devices have become increasingly common in current society for providing wireless communication services. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

Fifth-generation (5G) new radio (NR) (5G-NR) wireless communication technology has been widely regarded as the next wireless communication standard beyond the current third-generation (3G) communication standard, such as wideband code division multiple access (WCDMA), and fourth-generation (4G) communication standard, such as long-term evolution (LTE). As such, a 5G-NR capable mobile communication device is expected to achieve significantly higher data rates, improved coverage range, enhanced signaling efficiency, and reduced latency compared to a conventional mobile communication device supporting only the 3G and 4G communication standards.

The 5G-NR capable mobile communication device can be configured to transmit an RF signal(s) in a millimeter wave (mmWave) radio frequency (RF) spectrum(s), such as a RF spectrum above 28 GHz. RF signals transmitted in the mmWave RF spectrum are susceptible to attenuation and interference. In this regard, the 5G-NR capable mobile communication device typically employs power amplifier phase array and antenna array to shape the RF signal(s) into a directional RF beam(s) for transmission in the mmWave RF spectrum(s). Depending on the application scenarios supported by the 5G-NR capable mobile communication device, the power amplifier phase array may be configured to include from tens to hundreds of power amplifiers. Notably, power amplifiers in the power amplifier phase array can generate excessive heat when operating at suboptimal efficiency. As such, it may be desired to improve operating efficiency of the power amplifier phase array to help reduce heat dissipation in the 5G-NR capable mobile communication device.

SUMMARY

Embodiments of the disclosure relate to a power management circuit and related radio frequency (RF) front-end circuit. In examples discussed herein, a power management circuit can be incorporated into an RF front-end circuit to support RF beamforming in a millimeter wave (mmWave) spectrum(s) (e.g., above 24 GHz). In this regard, the power management circuit is configured to generate multiple output voltages to drive multiple power amplifier subarrays in the RF front-end circuit. More specifically, the power management circuit is configured to generate the output voltages based on a voltage scaling factor(s) such that each of the output voltages corresponds proportionally to a battery voltage received by the power management circuit. As such, the output voltages can be dynamically controlled based on the voltage scaling factor(s) to maximize operating efficiency of the power amplifier subarrays. As a result, it is possible to reduce heat dissipation of the power amplifier subarrays and improve overall thermal performance of the RF front-end circuit.

In one aspect, an apparatus is provided. The apparatus includes power control circuitry comprising a number of supply voltage outputs. The power control circuit is configured to receive a battery voltage and a clock signal comprising repeating clock cycles. The power control circuitry is also configured to generate a number of supply voltages based on the clock signal at the number of supply voltage outputs. The number of supply voltages corresponds proportionally to the battery voltage based on one or more voltage scaling factors. The apparatus also includes a number of voltage circuits coupled to the number of supply voltage outputs and configured to generate a number of output voltages based on the number of supply voltages, respectively. The apparatus also includes a number of voltage outputs coupled to the number of voltage circuits and configured to output the number of output voltages, respectively.

In another aspect, an RF front-end circuit is provided. The RF front-end circuit includes a power management circuit. The power management circuit includes power control circuitry comprising a number of supply voltage outputs. The power control circuitry is configured to receive a battery voltage and a clock signal comprising repeating clock cycles. The power control circuitry is also configured to generate a number of supply voltages based on the clock signal at the number of supply voltage outputs. The number of supply voltages corresponds proportionally to the battery voltage based on one or more voltage scaling factors. The power management circuit also includes a number of voltage circuits coupled to the number of supply voltage outputs and configured to generate a number of output voltages based on the number of supply voltages, respectively. The power management circuit also includes a number of voltage outputs coupled to the number of voltage circuits and configured to output the number of output voltages, respectively. The RF front-end circuit also includes a number of power amplifier subarrays each comprising one or more power amplifiers and configured to amplify an RF signal based on the number of output voltages, respectively.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
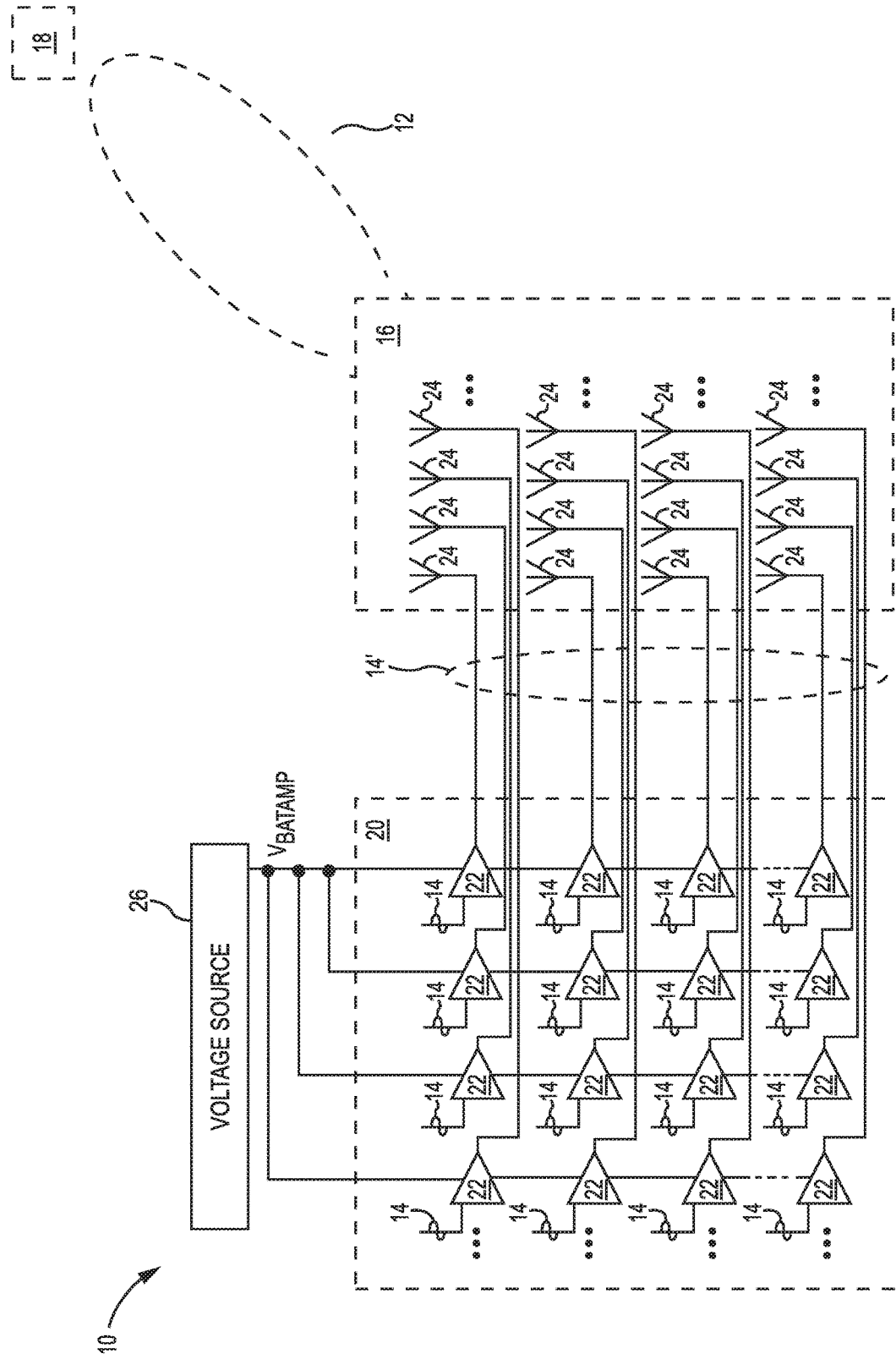
FIG. 1 is a schematic diagram of an exemplary conventional radio frequency (RF) front-end circuit configured to form an RF beam for transmitting an RF signal from an antenna array to a receiver.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the disclosure relate to a power management circuit and related radio frequency (RF) front-end circuit. In examples discussed herein, a power management circuit can be incorporated into an RF front-end circuit to support RF beamforming in a millimeter wave (mmWave) spectrum(s) (e.g., above 24 GHz). In this regard, the power management circuit is configured to generate multiple output voltages to drive multiple power amplifier subarrays in the RF front-end circuit. More specifically, the power management circuit is configured to generate the output voltages based on a voltage scaling factor(s) such that each of the output voltages corresponds proportionally to a battery voltage received by the power management circuit. As such, the output voltages can be dynamically controlled based on the voltage scaling factor(s) to maximize operating efficiency of the power amplifier subarrays. As a result, it is possible to reduce heat dissipation of the power amplifier subarrays and improve overall thermal performance of the RF front-end circuit.

Before discussing the power management circuit and the related RF front-end circuit of the present disclosure, a brief overview of a conventional RF front-end circuit configured to support RF beamforming is first provided with reference to FIG. 1. The discussion of specific exemplary aspects of a power management circuit and an RF front-end circuit incorporating the power management circuit starts below with reference to FIG. 2.

FIG. 1 is a schematic diagram of an exemplary conventional RF front-end circuit 10 configured to form an RF beam 12 for transmitting an RF signal 14 from an antenna array 16 to a receiver 18. The conventional RF front-end circuit 10 includes a power amplifier array 20. The power amplifier array 20 includes multiple power amplifiers 22 that are coupled to multiple antennas 24 in the antenna array 16. The multiple power amplifiers 22 are configured to amplify the RF signal 14 to generate multiple amplified RF signals 14', respectively. The multiple antennas 24 receive the multiple amplified RF signals 14' and radiate the multiple amplified RF signals 14' in the RF beam 12.

The multiple amplified RF signals 14' transmitted from the multiple antennas 24 can arrive at the receiver 18 via different propagation paths and thus are subject to different delays and/or attenuations. As such, the RF signals 14 and/or the multiple amplified RF signals 14' are pre-phase adjusted to accommodate the different delay, thus ensuring that the multiple amplified RF signals 14' arrive at the receiver 18 concurrently. Further, the multiple power amplifiers 22 are configured to amplify the RF signal 14 to different power levels to compensate for the attenuations associated with the different propagation paths and/or antenna losses.

The conventional RF front-end circuit 10 includes a voltage source 26, which can be a battery or a low dropout regulator (LDO) for example, configured to provide a supply voltage $V_{BATAMP}$ to each of the multiple power amplifiers 22 in the power amplifier array 20. Accordingly, the multiple power amplifiers 22 generate the multiple amplified RF signals 14' at different power levels based on the same supply voltage $V_{BATAMP}$.

In a non-limiting example, the supply voltage $V_{BATAMP}$ is determined based on a maximum power level that the multiple power amplifiers 22 need to amplify the RF signal 14 to. However, some power amplifiers among the multiple power amplifiers 22 may be configured to amplify the RF signal 14 to a lower power level than the maximum power level. As such, these power amplifiers will receive an excessive supply voltage, thus resulting in increased heat dissipation in the conventional RF front-end circuit 10. As such, it may be desirable to optimize operating efficiency of the multiple power amplifiers 22 to help improve thermal performance of the conventional RF front-end circuit 10.

Figure 2:
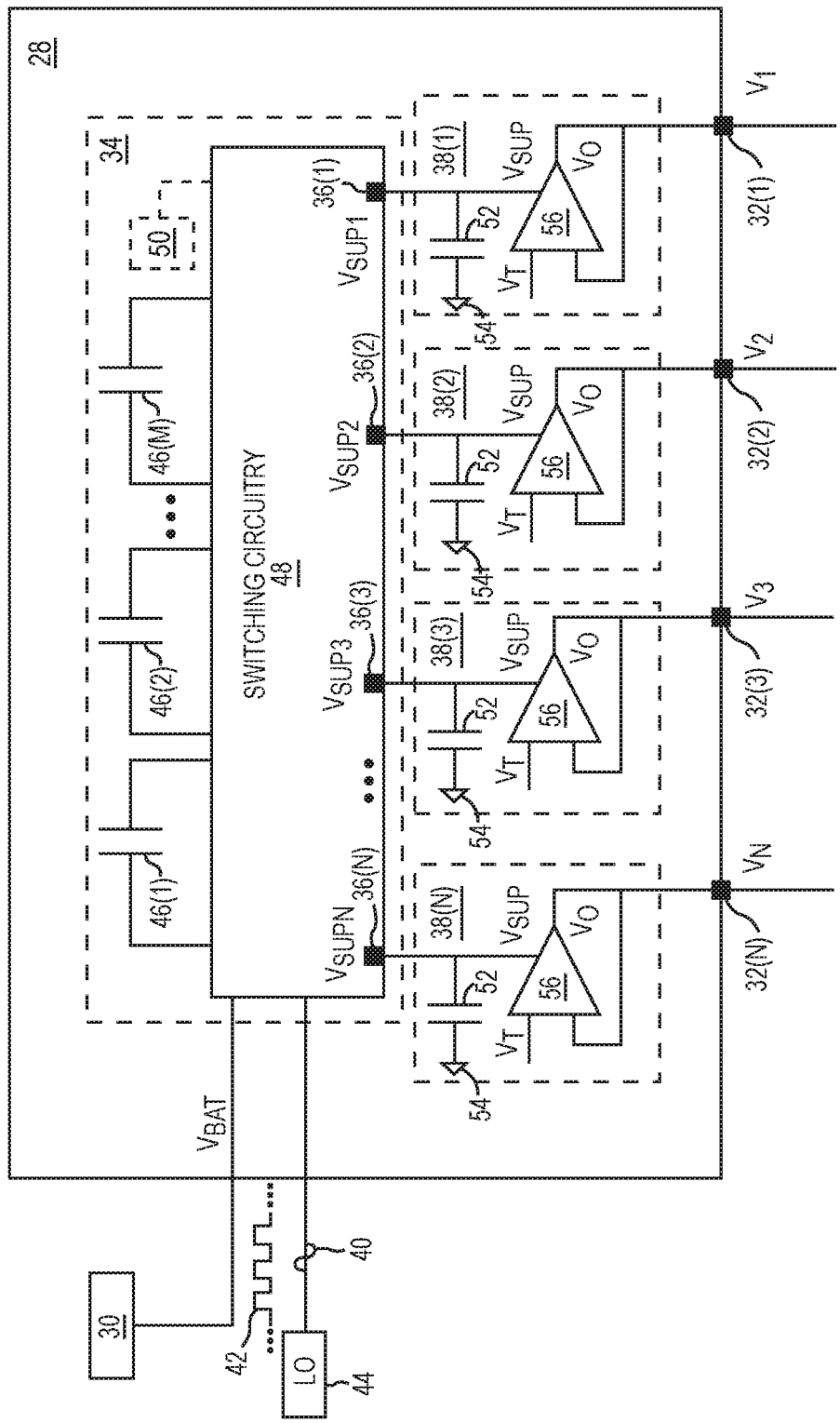
FIG. 2 is a schematic diagram of an exemplary power management circuit according to one embodiment of the present disclosure.

In this regard, FIG. 2 is a schematic diagram of an exemplary power management circuit 28 according to one embodiment of the present disclosure. The power management circuit 28 receives a battery voltage $V_{BAT}$ from a voltage source 30 and can generate a number of output voltages $V_1$-$V_N$ corresponding proportionally to the battery voltage $V_{BAT}$ based on one or more voltage scaling factors. As discussed subsequently in FIGS. 3A-3F, the power management circuit 28 can determine and control the voltage scaling factors inherently. Accordingly, it is possible for the power management circuit 28 to dynamically control the output voltages $V_1$-$V_N$ by adjusting the voltage scaling factors. Further, as discussed later in FIG. 5, the power management circuit 28 can be provided in an RF front-end circuit to help maximize operating efficiency of multiple power amplifier subarrays while performing RF beamforming to transmit an RF signal in a mmWave spectrum(s). As a result, it is possible to reduce heat dissipation of the power amplifier subarrays to improve overall thermal performance of the RF front-end circuit.

The power management circuit 28 includes a number of voltage outputs 32(1)-32(N) configured to output the output voltages $V_1$-$V_N$, respectively. The power management circuit 28 includes power control circuitry 34, which includes a number of supply voltage outputs 36(1)-36(N). The power management circuit 28 further includes a number of voltage circuits 38(1)-38(N) coupled between the supply voltage outputs 36(1)-36(N) and the voltage outputs 32(1)-32(N), respectively.

The power control circuitry 34 receives a clock signal 40 that includes repeating clock cycles 42. In a non-limiting example, the clock signal 40 is received from a local oscillator (LO) 44. As discussed in detail later in FIGS. 3A-3F, the power control circuitry 34 utilizes the clock signal 40 to control the voltage scaling factors internally. As a result, the power control circuitry 34 can generate a number of supply voltages $V_{SUP1}$-$V_{SUPN}$, which correspond proportionally to the battery voltage $V_{BAT}$ based on the voltage scaling factors, at the supply voltage outputs 36(1)-36(N), respectively. In addition, by dynamically adjusting the voltage scaling factors, the power control circuitry 34 can dynamically adjust the supply voltages $V_{SUP1}$-$V_{SUPN}$.

The voltage circuits 38(1)-38(N) receive the supply voltages $V_{SUP1}$-$V_{SUPN}$ via the supply voltage outputs 36(1)-36(N), respectively. The voltage circuits 38(1)-38(N) are configured to generate the output voltages $V_1$-$V_N$ based on the supply voltages $V_{SUP1}$-$V_{SUPN}$ and provide the output voltages $V_1$-$V_N$ to the voltage outputs 32(1)-32(N), respectively. In a non-limiting example, the output voltages $V_1$-$V_N$ are positively related to the supply voltages $V_{SUP1}$-$V_{SUPN}$, respectively. As such, by dynamically adjusting the voltage scaling factors, the power control circuitry 34 can dynamically adjust the supply voltages $V_{SUP1}$-$V_{SUPN}$, thus causing the output voltages $V_1$-$V_N$ to change accordingly. In this regard, the power management circuit 28 can dynamically adjust the output voltages $V_1$-$V_N$ by dynamically adjusting the voltage scaling factors.

The power control circuitry 34 includes a number of capacitors 46(1)-46(M) and switching circuitry 48. The switching circuitry 48, which includes multiple switches, is coupled to the capacitors 46(1)-46(M). The power control circuitry 34 includes control circuitry 50, which can be a microprocessor, a digital signal processor (DSP), a microcontroller, or a field-programmable gate array (FPGA), for example. Although the control circuitry 50 is shown in FIG. 2 to be inside the power control circuitry 34, it should be appreciated that it is also possible to provide the control circuitry 50 outside the power control circuitry 34. For example, the control circuitry 50 can be provided outside the power control circuitry 34, but inside the power management circuit 28. Further, it may also be possible to provide the control circuitry 50 outside the power management circuit 28 (e.g., in a transceiver circuit) and communicatively couple the control circuitry 50 to the power management circuit 28. In this regard, functionalities and operation principles of the power management circuit 28 remain the same regardless of specific implementation of the control circuitry 50.

The control circuitry 50 is configured to control the switching circuitry 48 to alternately couple the capacitors 46(1)-46(M) to each of the supply voltage outputs 36(1)-36(N) according to the repeating clock cycles 42 (e.g., $CLK_1$, $CLK_2$, $CLK_3$, $CLK_4$, $CLK_5$, and so on) of the clock signal 40 to generate the supply voltages $V_{SUP1}$-$V_{SUPN}$ at the supply voltage outputs 36(1)-36(N). In this regard, FIGS. 3A-3F are schematic diagrams providing exemplary illustrations of the power control circuitry 34 of FIG. 2 configured according to one embodiment of the present disclosure to generate the supply voltages $V_{SUP1}$-$V_{SUPN}$ that correspond proportionally to the battery voltage $V_{BAT}$. Common elements between FIGS. 2 and 3A-3F are shown therein with common element numbers and will not be re-described herein.

Figures 3A, 3B:
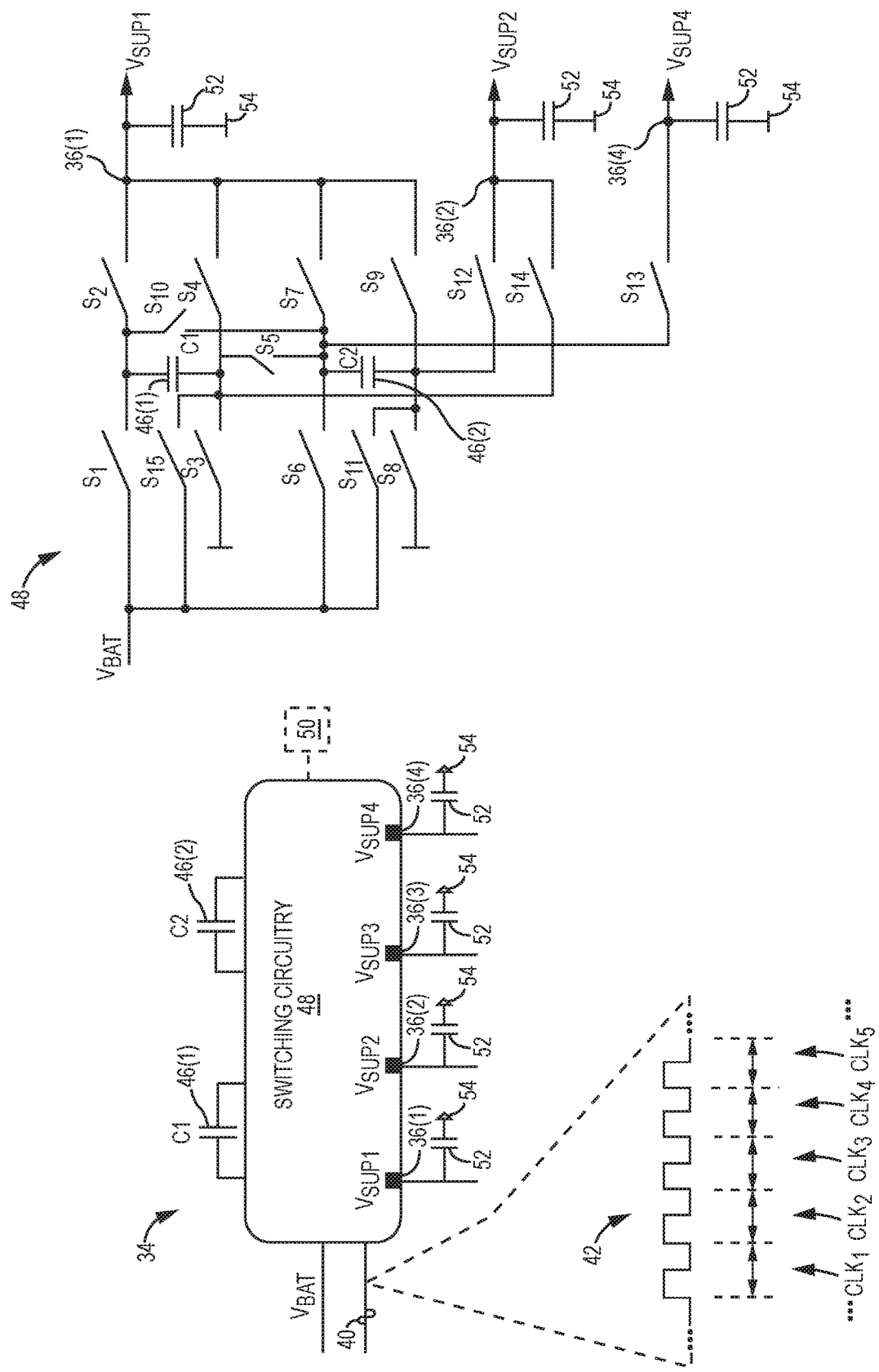
FIGS. 3A-3F are schematic diagrams providing exemplary illustrations of a power control circuitry in the power management circuit of FIG. 2 configured according to one embodiment of the present disclosure to generate multiple supply voltages corresponding proportionally to a battery voltage.

FIG. 3A is a schematic diagram providing an exemplary illustration of the power control circuitry 34 according to one embodiment of the present disclosure. As shown in FIG. 3A, the switching circuitry 48 is coupled to capacitors 46(1) and 46(2) and configured to generate supply voltages $V_{SUP1}$-$V_{SUP4}$ at supply voltage outputs 36(1)-36(4), respectively. The capacitors 46(1) and 46(2) have capacitances C1 and C2, respectively. Notably, the power control circuitry 34 can provide finer granularity for the supply voltages $V_1$-$V_4$ by including more than the capacitors 46(1) and 46(2). Further, the power control circuitry 34 can also generate more than the supply voltages $V_{SUP1}$-$V_{SUP4}$ based on the capacitors 46(1) and 46(2). As such, the capacitors 46(1) and 46(2) and the supply voltages $V_{SUP1}$-$V_{SUP4}$ are simply non-limiting examples.

Each of the supply voltage outputs 36(1)-36(4) is coupled to a holding capacitor 52, which is further coupled to a ground 54. The holding capacitor 52 is configured to maintain a respective supply voltage among the supply voltages $V_{SUP1}$-$V_{SUP4}$ between the repeating clock cycles 42. For example, the holding capacitor 52 coupled to the supply voltage output 36(1) is configured to maintain the supply voltage $V_{SUP1}$ between the repeating clock cycles 42, the holding capacitor 52 coupled to the supply voltage output 36(2) is configured to maintain the supply voltage $V_{SUP2}$ between the repeating clock cycles 42, and so on.

In a non-limiting example, the power control circuitry 34 can inherently determine three voltage scaling factors based on the clock signal 40 and the capacitors 46(1) and 46(2). The voltage scaling factors include an independent voltage scaling factor, a first dependent voltage scaling factor, and a second dependent voltage scaling factor. In the examples discussed hereinafter, the independent voltage scaling factor, the first dependent voltage scaling factor, and the second dependent voltage scaling factor are denoted as x, 1−x, and 1+x, respectively. As such, by changing the independent voltage scaling factor x, the first dependent voltage scaling factor 1−x and the second dependent voltage scaling factor 1+x would change accordingly. As discussed below, the independent voltage scaling factor x, the first dependent voltage scaling factor 1−x, and the second dependent voltage scaling factor 1+x can in turn change the supply voltages $V_{SUP1}$-$V_{SUP4}$ at the supply voltage outputs 36(1)-36(4). In a non-limiting example discussed herein, the power control circuitry 34 is configured to generate the supply voltages $V_{SUP1}$-$V_{SUP4}$ that equal $x*V_{BAT}$, $(1-x)*V_{BAT}$, $V_{BAT}$, and $(1+x)*V_{BAT}$, respectively. In this regard, the supply voltages $V_{SUP1}$-$V_{SUP4}$ correspond proportionally to the battery voltage $V_{BAT}$ based on the voltage scaling factors.

As mentioned earlier, the power control circuitry 34 can also generate more than the supply voltages $V_{SUP1}$-$V_{SUP4}$ based on the capacitors 46(1) and 46(2). However, with only three different voltage scaling factors x, 1−x, and 1+x, some of the supply voltages may be identical.

The independent voltage scaling factor x, and thus the first dependent voltage scaling factor 1−x and the second dependent voltage scaling factor 1+x, can be changed based on the clock signal 40 and the capacitors 46(1) and 46(2). In this regard, FIG. 3B is a schematic diagram providing an exemplary illustration of the switching circuitry 48 according to one embodiment of the present disclosure.

As shown in FIG. 3B, the switching circuitry 48 includes switches $S_1$-$S_{15}$. Notably, the switches $S_1$-$S_{15}$ are shown herein merely as non-limiting examples. It should be appreciated that the switching circuitry 48 can be implemented based on any number, type, and/or layout of the switches without affecting functionality and operation principle of the switching circuitry 48. Further, for the sake of simplicity, only the supply voltages $V_1$, $V_2$, and $V_4$, which relate directly to the independent voltage scaling factor x, the first dependent voltage scaling factor (1−x), and the second dependent voltage scaling factor (1+x), are discussed herein. As discussed below in FIGS. 3C-3F, the control circuitry 50 alternately couples the capacitors 46(1) and 46(2) to each of the supply voltage outputs 36(1), 36(2), and 36(4) to generate the supply voltages $V_{SUP1}$, $V_{SUP2}$, and $V_{SUP4}$ based on the repeating clock cycles 42 (e.g., $CLK_1$, $CLK_2$, $CLK_3$, $CLK_4$, and so on) of the clock signal 40.

Figure 3C:
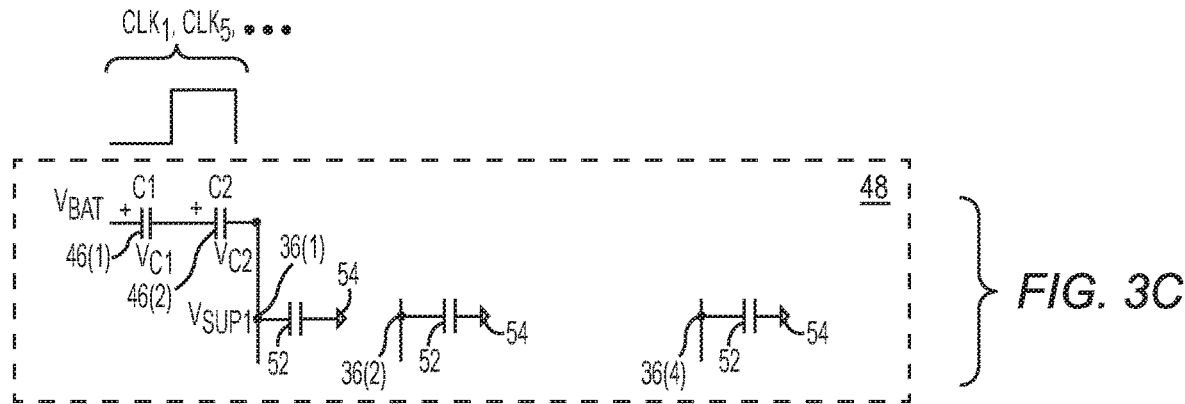

During the clock cycle $CLK_1$, as shown in FIG. 3C, the control circuitry 50 closes switches $S_1$, $S_5$, and $S_9$, while opening all other switches, in the switching circuitry 48 of FIG. 3B. As a result, the capacitors 46(1) and 46(2) are coupled in series to the supply voltage output 36(1). Accordingly, the supply voltage $V_{SUP1}$ at the supply voltage output 36(1) can be expressed in equation (Eq. 1) below.

$$V_{SUP1} = V_{BAT} - V_{C1} - V_{C2} \quad \text{(Eq. 1)}$$

Figure 3D:
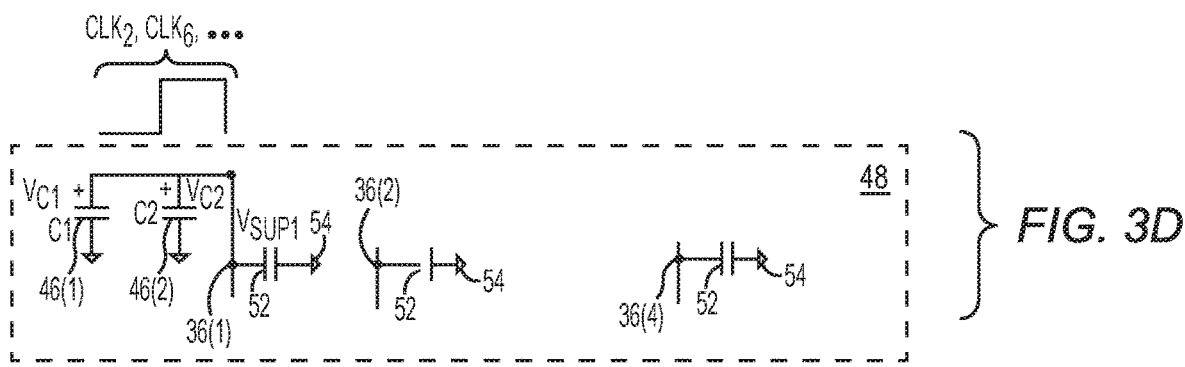

In the equation, Eq. 1, above, $V_{C1}$ and $V_{C2}$ represent voltages across the capacitor 46(1) and the capacitor 46(2), respectively. During the clock cycle $CLK_2$, as shown in FIG. 3D, the control circuitry 50 closes switches $S_2$, $S_3$, $S_7$, and $S_8$, while opening all other switches, in the switching circuitry 48 of FIG. 3B. As a result, the capacitors 46(1) and 46(2) are coupled in parallel to the supply voltage output 36(1). Accordingly, the supply voltage $V_{SUP1}$ at the supply voltage output 36(1) can be expressed in equation (Eq. 2) below.

$$V_{SUP1} = V_{C1} = V_{C2} \quad \text{(Eq. 2)}$$

Given that the holding capacitor 52 coupled to the supply voltage output 36(1) maintains the supply voltage $V_{SUP1}$ between the clock cycles $CLK_1$ and $CLK_2$, the supply voltage $V_{SUP1}$ can be determined based on the equations, Eq. 1 and Eq. 2, to be equal to $\frac{1}{3}*V_{BAT}$, as expressed in equation (Eq. 3) below.

$$V_{SUP1} = V_{C1} = V_{C2} = \frac{1}{3}*V_{BAT} \quad \text{(Eq. 3)}$$

Figure 3E:
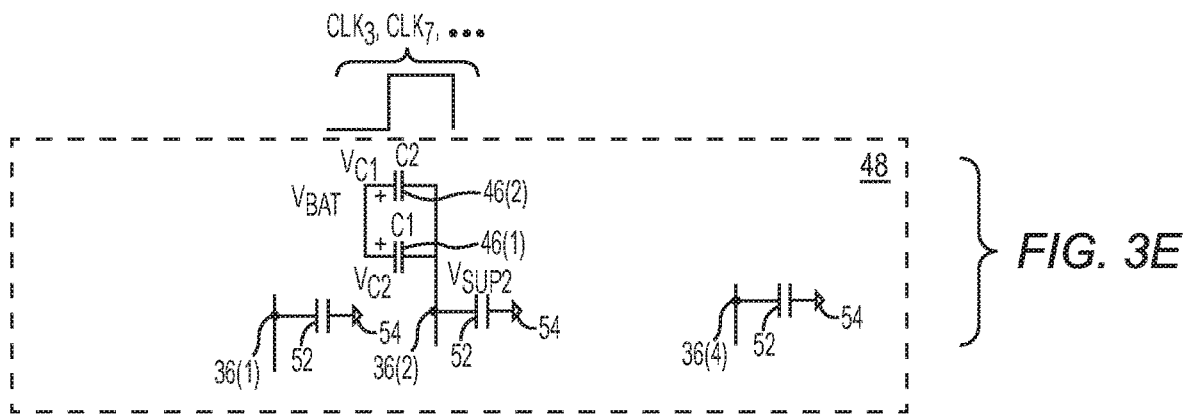

Given that the supply voltage $V_{SUP1}$ also equals the independent voltage scaling factor x times the battery voltage $V_{BAT}$ ($x*V_{BAT}$), the independent voltage scaling factor can thus be determined inherently as being equal to ⅓. During the clock cycle $CLK_3$, as shown in FIG. 3E, the control circuitry 50 closes switches $S_1$, $S_6$, $S_{12}$, and $S_{14}$, while opening all other switches, in the switching circuitry 48 of FIG. 3B. As a result, the capacitors 46(1) and 46(2) are coupled in parallel to the supply voltage output 36(2). Accordingly, the supply voltage $V_{SUP2}$ at the supply voltage output 36(2) can be expressed in equation (Eq. 4) below.

$$V_{SUP2} = V_{BAT} - V_{C1} = V_{BAT} - V_{C2} \quad \text{(Eq. 4)}$$

Thus, based on equations, Eq. 3 and Eq. 4, the supply voltage $V_{SUP2}$ can be determined to equal $(1-\frac{1}{3})*V_{BAT}$. Given that the independent voltage scaling factor x, as determined above, also equals ⅓, the supply voltage $V_{SUP2}$ thus equals $(1-x)*V_{BAT}$ inherently.

Figure 3F:
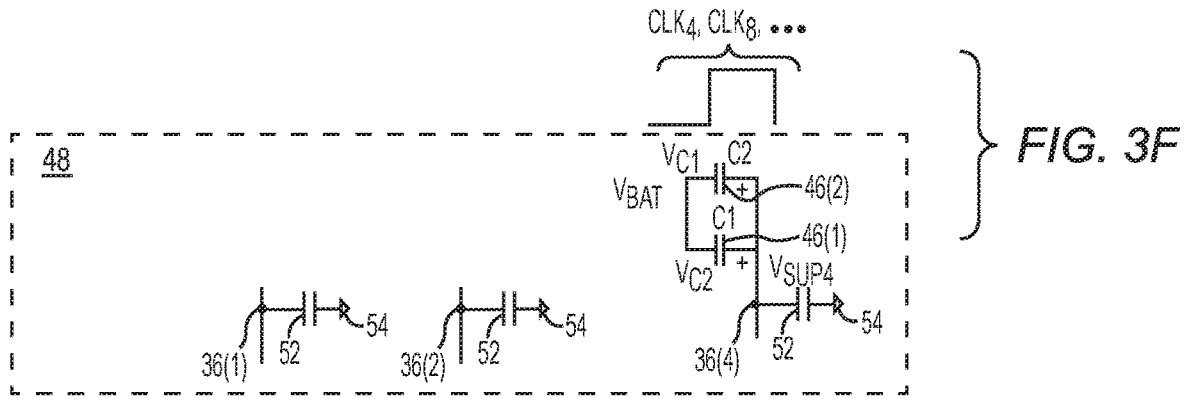

During the clock cycle $CLK_4$, as shown in FIG. 3F, the control circuitry 50 closes switches $S_{10}$, $S_{11}$, $S_{13}$, and $S_{15}$, while opening all other switches, in the switching circuitry 48 of FIG. 3B. As a result, the capacitors 46(1) and 46(2) are coupled in parallel to the supply voltage output 36(4). Accordingly, the supply voltage $V_{SUP4}$ at the supply voltage output 36(4) can be expressed in equation (Eq. 5) below.

$$V_{SUP4} = V_{BAT} + V_{C1} = V_{BAT} + V_{C2} \quad \text{(Eq. 5)}$$

Thus, based on equations, Eq. 3 and Eq. 5, the supply voltage $V_{SUP4}$ can be determined to equal $(1+\frac{1}{3})*V_{BAT}$. Given that the independent voltage scaling factor x, as determined above, also equals ⅓, the supply voltage $V_{SUP4}$ thus equals $(1+x)*V_{BAT}$ inherently. Thus, by alternately coupling the capacitors 46(1) and 46(2) to each of the supply voltage outputs 36(1), 36(2), and 36(4) in clock cycles $CLK_1$-$CLK_4$, it is possible to generate the supply voltages $V_{SUP1}$, $V_{SUP2}$, and $V_{SUP4}$ that equal $x*V_{BAT}$, $(1-x)*V_{BAT}$, and $(1+x)*V_{BAT}$, respectively.

In subsequent clock cycles $CLK_5$, $CLK_6$, $CLK_7$, $CLK_5$, and so on, the operation as illustrated in FIGS. 3C-3F repeats in a round-robin fashion. Notably, to carry out the operations as illustrated in FIGS. 3C-3F, the holding capacitors 52 need to maintain the supply voltages $V_{SUP1}$, $V_{SUP2}$, and $V_{SUP4}$ across at least the clock cycles $CLK_1$-$CLK_4$. As such, duration of the clock cycles $CLK_1$-$CLK_4$ need to be shorter than the discharging period of the holding capacitors 52. In a non-limiting example, the clock signal 40 can be configured to have a clock frequency of at least 2 MHz.

With reference back to FIG. 2, each of the voltage circuits 38(1)-38(N) includes a voltage amplifier 56. The voltage amplifier 56 is configured to receive a respective target voltage $V_T$. The voltage amplifier 56 also receives a respective supply voltage $V_{SUP}$ among the supply voltages $V_{SUP1}$-$V_{SUPN}$ via a respective supply voltage output among the supply voltage outputs 36(1)-36(N). The voltage amplifier 56 is configured to generate a respective output voltage $V_O$ among the output voltages $V_1$-$V_N$ based on the respective supply voltage $V_{SUP}$. In a non-limiting example, the respective target voltage $V_T$ is an average power tracking (APT) target voltage. Accordingly, the respective output voltage $V_O$, which tracks the respective target voltage $V_T$, is an APT output voltage. Subsequently, the voltage amplifier 56 provides the respective output voltage $V_O$ to a respective voltage output among the voltage outputs 32(1)-32(N). Notably, since the respective target voltage $V_T$ may be different for each of the voltage amplifiers 56 in the voltage circuits 38(1)-38(N), the respective output voltage $V_O$ generated by each of the voltage amplifiers 56 can be different as well. In addition, the respective target voltage $V_T$ for each of the voltage amplifiers 56 is less than a respective supply voltage $V_{SUP}$.

As shown in FIG. 2, the holding capacitor 52 in each of the voltage circuits 38(1)-38(N) is coupled between a respective supply voltage output among the supply voltage outputs 36(1)-36(N) and the ground 54. Notably, the holding capacitor 52 in each of the voltage circuits 38(1)-38(N) can also be coupled between a respective voltage output among the voltage outputs 32(1)-32(N) and the ground 54.

Figure 4:
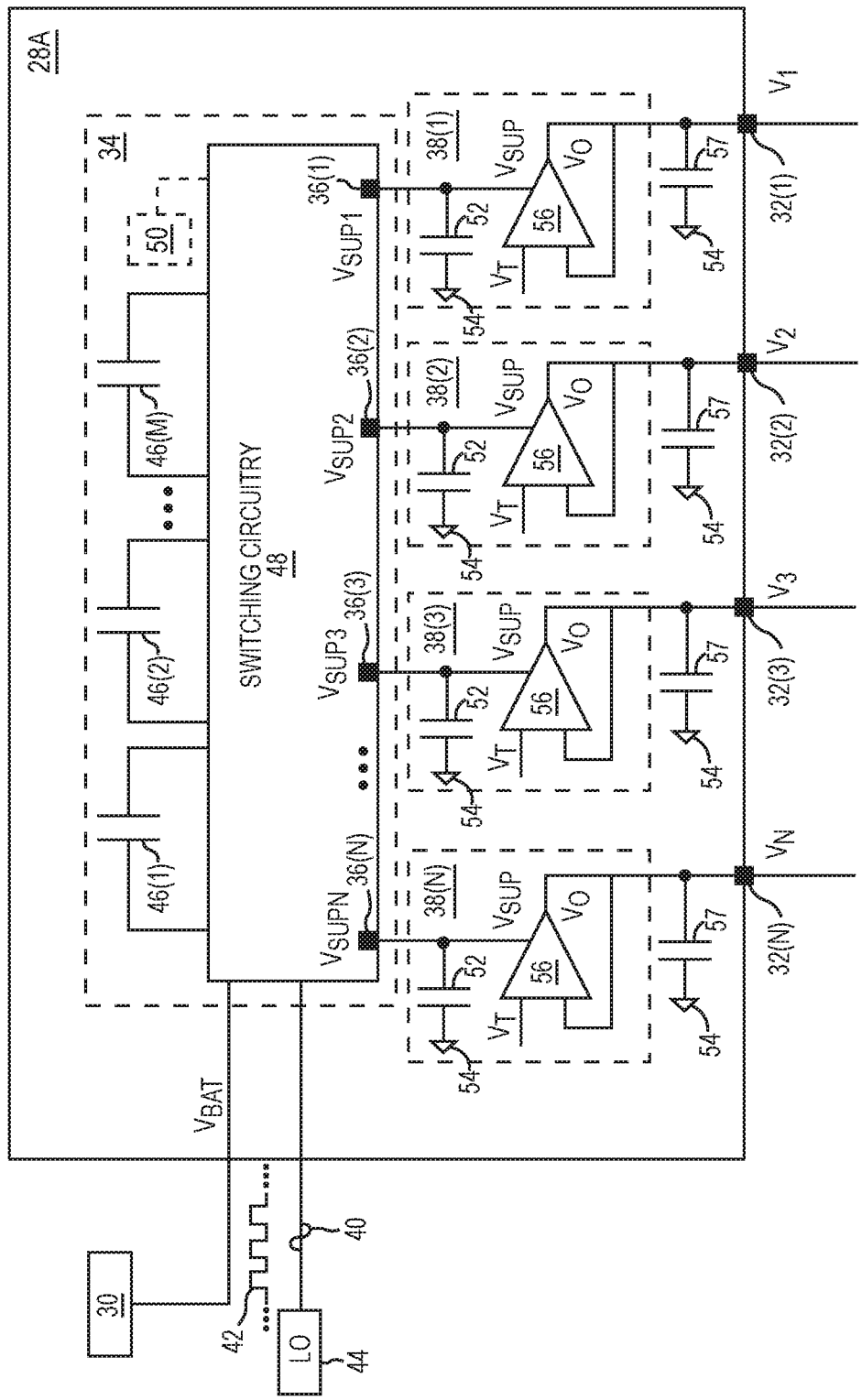
FIG. 4 is a schematic diagram of an exemplary power management circuit configured according to another embodiment of the present disclosure.

In this regard, FIG. 4 is a schematic diagram of an exemplary power management circuit 28A configured according to another embodiment of the present disclosure. Common elements between FIGS. 2 and 4 are shown therein with common element numbers and will not be re-described herein. As shown in FIG. 4, each of the voltage circuits 38(1)-38(N) also includes a filter capacitor 57. The filter capacitors 57 in each of the voltage circuits 38(1)-38(N) are coupled between a respective voltage output among the voltage outputs 32(1)-32(N) and the ground 54.

Figure 5:
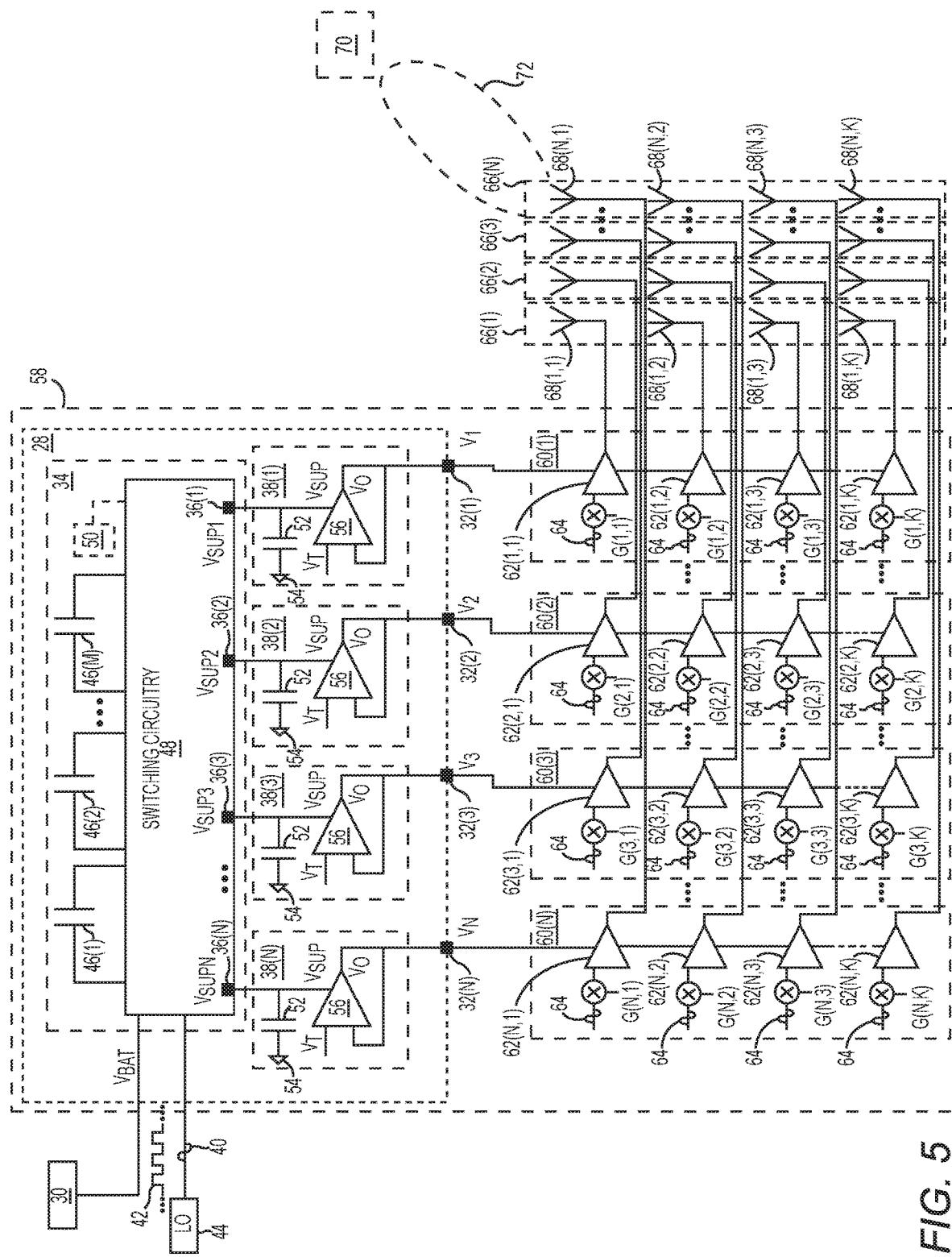
FIG. 5 is a schematic diagram of an exemplary RF front-end circuit incorporating the power management circuit of FIG. 2.

The power management circuit 28 of FIG. 2 can be provided in an RF front-end circuit to help improve thermal performance of the RF front-end circuit. In this regard, FIG. 5 is a schematic diagram of an exemplary RF front-end circuit 58 incorporating the power management circuit 28 of FIG. 2. Common elements between FIGS. 2 and 5 are shown therein with common element numbers and will not be re-described herein.

The RF front-end circuit 58 includes a number of power amplifier subarrays 60(1)-60(N). Each of the power amplifier subarrays 60(1)-60(N) includes one or more power amplifiers 62(i, 1)-62(i, K) (1≤i≤N). In other words, the RF front-end circuit 58 includes a total of N×K power amplifiers 62(1, 1)-62(N, K) organized into N power amplifier subarrays. The power amplifier subarrays 60(1)-60(N) are coupled to the voltage outputs 32(1)-32(N) to receive the output voltages $V_1$-$V_N$, respectively. Accordingly, the power amplifier subarrays 60(1)-60(N) amplify an RF signal 64 based on the output voltages $V_1$-$V_N$, respectively.

The power amplifier subarrays 60(1)-60(N) are coupled to a number of antenna subarrays 66(1)-66(N), respectively. Each of the antenna subarrays 66(1)-66(N) includes one or more antennas 68(i, 1)-68(i, K) (1≤i≤N). The antenna subarrays 66(1)-66(N) are configured to receive the RF signal 64 from the power amplifier subarrays 60(1)-60(N), respectively, and transmit the RF signal 64 to a receiver 70 in a formed RF beam(s) 72.

According to previous discussions in FIG. 1, the RF signal 64 transmitted in the formed RF beam 72 may arrive at the receiver 70 via different propagation paths, and thus is subject to different propagation delays and/or attenuations. As such, the RF signal 64 received by the power amplifier subarrays 60(1)-60(N) may be phase adjusted to accommodate the propagation delays. Accordingly, the power amplifier subarrays 60(1)-60(N) may be configured to adjust amplitude of the RF signal 64 to compensate for the propagation attenuations and/or antenna losses, without altering the phase of the RF signal 64. In this regard, the power amplifiers 62(1, 1)-62(N, K) in the RF front-end circuit 58 are configured to have programmed gains G(1, 1)-G(N, K), respectively. Accordingly, the power amplifiers 62(i, j) (1≤i≤N, 1≤j≤K) in each of the power amplifier subarrays 60(1)-60(N) correspond to programmed gains G(i, j) (1≤i≤N, 1≤j≤K), respectively.

By organizing the power amplifiers 62(1, 1)-62(N, K) into the power amplifier subarrays 60(1)-60(N), it is possible to adapt each of the output voltages $V_1$-$V_N$ on a per-subarray basis. In this regard, all of the power amplifiers 62(i, j) (1≤i≤N, 1≤j≤K) in the power amplifier subarray 60(i) (1≤i≤N) would be driven by the same output voltage $V_1$ (1≤i≤N). In contrast to the conventional RF front-end circuit 10 of FIG. 1, in which all power amplifiers are driven by a uniform output voltage, the RF front-end circuit 58 can optimize power amplifier efficiency on a finer scale, thus helping to reduce potential heat dissipation and improve overall thermal performance of the RF front-end circuit 58.

In one embodiment, it is possible to adapt an output voltage $V_1$ (1≤i≤N) for a power amplifier subarray 60(i) (1≤i≤N) based on a maximum programmed gain max(G) among the programmed gains G(i, j) (1≤i≤N, 1≤j≤K). For example, in the power amplifier subarray 60(1), the power amplifier 62(1, 1) has a programmed gain of 50 dB, while all other power amplifiers 62(1, 2)-62(1, K) have the same programmed gain of 25 dB. In this regard, the output voltage $V_1$ can be determined based on the max programmed gain of 50 dB.

In another embodiment, it may be possible to first adjust a max programmed gain in a power amplifier subarray prior to determining the output voltage based on the max programmed gain. Using the same example described above, the power amplifier 62(1, 1) has the programmed gain of 50 dB, and all other power amplifiers 62(1, 2)-62(1, K) have the programmed gain of 25 dB. In this regard, it may be possible to first reduce the programmed gain of the power amplifier 62(1, 1) from 50 dB to 30 dB and then adjust the output voltage $V_1$ based on the 30 dB max programmed gain. As a result, the power amplifiers 62(1, 2)-62(1, K) would receive a reduced output voltage $V_1$, thus helping to further reduce heat dissipation generated by the power amplifiers 62(1, 2)-62(1, K). Notably, reducing the programmed gain of the power amplifier 62(1, 1) from 50 dB to 30 dB may result in degraded side lobe(s) in the formed RF beam 72. Nevertheless, it may be a worthwhile trade-off compared to potential improvements in power amplifier efficiency and heat dissipation.

Those skilled in the art will recognize improvements and modifications to the preferred embodiments of the present disclosure. All such improvements and modifications are considered within the scope of the concepts disclosed herein and the claims that follow.

What is claimed is:

1. An apparatus comprising:
power control circuitry comprising a plurality of supply voltage outputs and configured to:
receive a battery voltage and a clock signal comprising repeating clock cycles;
determine one or more voltage scaling factors based on the clock signal; and
generate a plurality of supply voltages based on the clock signal at the plurality of supply voltage outputs, wherein the plurality of supply voltages corresponds proportionally to the battery voltage based on the one or more voltage scaling factors;
a plurality of voltage circuits coupled to the plurality of supply voltage outputs and configured to generate a plurality of output voltages based on the plurality of supply voltages, respectively; and
a plurality of voltage outputs coupled to the plurality of voltage circuits and configured to output the plurality of output voltages, respectively.

2. The apparatus of claim 1 further comprising:
a power management circuit comprising the power control circuitry, the plurality of voltage circuits, and the plurality of voltage outputs; and
a plurality of power amplifier subarrays each comprising one or more power amplifiers and configured to amplify an RF signal based on the plurality of output voltages, respectively.

3. The apparatus of claim 1 wherein the power control circuitry comprises:
a plurality of capacitors;
switching circuitry coupled to the plurality of capacitors; and
control circuitry configured to control the switching circuitry to alternately couple the plurality of capacitors to each of the plurality of supply voltage outputs according to the repeating clock cycles of the clock signal to generate the plurality of supply voltages.

4. The apparatus of claim 3 wherein the one or more voltage scaling factors comprise an independent voltage scaling factor, a first dependent voltage scaling factor equaling one minus the independent voltage scaling factor, and a second dependent voltage scaling factor equaling one plus the independent voltage scaling factor.

5. The apparatus of claim 4 wherein the plurality of capacitors is configured to determine the independent voltage scaling factor.

6. The apparatus of claim 1 wherein at least one supply voltage among the plurality of supply voltages is different from at least one other supply voltage among the plurality of supply voltages.

7. The apparatus of claim 1 wherein at least one supply voltage among the plurality of supply voltages is identical to at least one other supply voltage among the plurality of supply voltages.

8. The apparatus of claim 1 wherein each of the plurality of supply voltages is an average-power-tracking (APT) voltage.

9. The apparatus of claim 1 wherein each of the plurality of voltage circuits comprises a voltage amplifier configured to:
receive a respective target voltage and a respective supply voltage among the plurality of supply voltages via a respective supply voltage output among the plurality of supply voltage outputs;
generate a respective output voltage tracking the respective target voltage based on the respective supply voltage; and
provide the respective output voltage to a respective voltage output among the plurality of voltage outputs.

10. The apparatus of claim 9 wherein each of the plurality of voltage circuits further comprises a holding capacitor coupled between the respective supply voltage output and a ground and configured to maintain the respective supply voltage between the repeating clock cycles of the clock signal.

11. The apparatus of claim 10 wherein each of the plurality of voltage circuits further comprises a filter capacitor coupled between the respective voltage output and a ground.

12. A radio frequency (RF) front-end circuit comprising:
a power management circuit comprising:
power control circuitry comprising a plurality of supply voltage outputs and configured to:
receive a battery voltage and a clock signal comprising repeating clock cycles;
determine one or more voltage scaling factors based on the clock signal; and
generate a plurality of supply voltages based on the clock signal at the plurality of supply voltage outputs, wherein the plurality of supply voltages corresponds proportionally to the battery voltage based on the one or more voltage scaling factors;
a plurality of voltage circuits coupled to the plurality of supply voltage outputs and configured to generate a plurality of output voltages based on the plurality of supply voltages, respectively; and
a plurality of voltage outputs coupled to the plurality of voltage circuits and configured to output the plurality of output voltages, respectively; and
a plurality of power amplifier subarrays each comprising one or more power amplifiers and configured to amplify an RF signal based on the plurality of output voltages, respectively.

13. The RF front-end circuit of claim 12 wherein the plurality of power amplifier subarrays is coupled to a plurality of antenna subarrays, respectively, and the plurality of antenna subarrays is configured to transmit the RF signal in at least one formed RF beam.

14. The RF front-end circuit of claim 12 further comprising control circuitry configured to control the power management circuit to generate the plurality of supply voltages based on the clock signal.

15. The RF front-end circuit of claim 14 wherein the one or more power amplifiers in each of the plurality of power amplifier subarrays are configured to operate based on one or more programmed gains, respectively.

16. The RF front-end circuit of claim 15 wherein the control circuitry is configured to determine a respective output voltage among the plurality of output voltages for a respective power amplifier subarray among the plurality of power amplifier subarrays based on a max programmed gain among the one or more power amplifiers in the respective power amplifier subarray.

17. The RF front-end circuit of claim 15 wherein the control circuitry is configured to:

adjust the one or more programmed gains in a respective power amplifier subarray among the plurality of power amplifier subarrays; and determine a respective output voltage among the plurality of output voltages for the respective power amplifier subarray based on a max programmed gain among the one or more power amplifiers in the respective power amplifier subarray.

18. The RF front-end circuit of claim 14 wherein the power control circuitry comprises:

a plurality of capacitors; and switching circuitry coupled to the plurality of capacitors;

wherein the control circuitry is configured to control the switching circuitry to alternately couple the plurality of capacitors to each of the plurality of supply voltage outputs according to the repeating clock cycles of the clock signal to generate the plurality of supply voltages.

19. The RF front-end circuit of claim 18 wherein the one or more voltage scaling factors comprise an independent voltage scaling factor, a first dependent voltage scaling factor equaling one minus the independent voltage scaling factor, and a second dependent voltage scaling factor equaling one plus the independent voltage scaling factor.

20. The RF front-end circuit of claim 12 wherein at least one supply voltage among the plurality of supply voltages is different from at least one other supply voltage among the plurality of supply voltages.

\* \* \* \* \*